United States Patent [19]

Araps et al.

[11] Patent Number: 4,654,223

[45] Date of Patent: Mar. 31, 1987

[54] METHOD FOR FORMING A FILM OF DIELECTRIC MATERIAL ON AN ELECTRIC COMPONENT

[75] Inventors: Constance J. Araps, Wappingers Falls; Steven M. Kandetzke, Fishkill; Mark A. Takacs, Poughkeepsie, all of N.Y.

[73] Assignee: International Business Machines Corporation, Armonk, N.Y.

[21] Appl. No.: 839,456

[22] Filed: Mar. 11, 1986

Related U.S. Application Data

[63] Continuation of Ser. No. 556,731, Nov. 30, 1983, abandoned.

[51] Int. Cl.$^4$ .............................................. B05D 5/12
[52] U.S. Cl. .................................... 427/12; 427/54.1; 427/82; 427/96; 427/337; 427/385.5; 430/319
[58] Field of Search ................... 427/35, 54.1, 82, 96, 427/337, 385.5, 12; 430/319

[56] References Cited

U.S. PATENT DOCUMENTS

| | | | |
|---|---|---|---|
| 3,671,490 | 6/1972 | Bargain ........................... | 524/726 X |
| 3,879,349 | 4/1975 | Bilow et al. ..................... | 528/128 X |
| 3,985,597 | 10/1976 | Zielinski ........................ | 427/90 X |
| 4,258,146 | 3/1981 | Balanson et al. ................ | 525/105 X |
| 4,347,306 | 8/1982 | Takeda et al. .................. | 427/265 X |

OTHER PUBLICATIONS

Sefelk et al "Investigation of the Structure . . ." Macromolecules, vol. 12, May/Jun. 1979, pp. 423–425.

*Primary Examiner*—Richard Bueker
*Attorney, Agent, or Firm*—Shirley C. Moore

[57] ABSTRACT

Thin dielectric films are formed on an electronic component by in situ curing a polymerizable oligomer which is end capped with vinyl and/or acetylenic end groups. The polymerizable oligomers are comprised of polyamic acids, polyamic esters, polyisoimides, and mixtures thereof which can be crosslinked to form a three-dimensional network via sites at the vinyl or acetylenic end groups and sites at carbonyl groups contained within the polymeric chain. Use of these polymerizable oligomers permits utilization of low temperature methods of curing which reduce intrinsic and extrinsic stress within the cured dielectric film.

19 Claims, No Drawings

METHOD FOR FORMING A FILM OF DIELECTRIC MATERIAL ON AN ELECTRIC COMPONENT

This application is a continuation of Ser. No. 556,731 filed Nov. 30, 1983 and now abandoned.

BACKGROUND OF THE INVENTION

1. Field of the Invention

The present invention relates to a method for forming thin films of a dielectric material on an electronic component.

2. Description of the Prior Art

There is a significant interest in the semi-conductor industry in replacing traditional inorganic dielectric materials with polymeric materials as device dielectric isolation layers, trenches, inter-level metal passivation layers, etc. Polymeric materials are less expensive, can be more easily purified and fabricated, and potentially have better thermal and electrical characteristics than some inorganic counterparts.

U.S. Pat. No. 4,347,306 Takeda et al discloses a method for manufacturing electronic devices having a multilayer wiring structure using a polyimide dielectric material between the layers. The polyimide dielectric material is a thermosetting addition polymerization type polyimide which possesses imide rings in recurring units and a degree of polymerization which increases when cured due to the radical reaction of the end group or groups thereof. Several of the materials of the present invention differ in structure from the polyimide and have superior properties, and all are cured by a different method from that disclosed in Takeda et al.

The following U.S. patents disclose polyimides polyimide-polyamides or like materials used as insulating or passivating materials in electronic components. However, none of the materials disclosed are equivalent to those of the present invention. U.S. Pat. Nos. 3,700,497 Epifano et al; 3,846,166 Saiki et al; 3,486,934 Bond; 3,515,585 Chamberlin et al; 3,985,597 Zielinski; 4,367,119 Logan et al. These patents are incorporated by reference, as is the earlier Shiro et al European Patent Application, since the polyimide materials of the present invention can be used as a substitute for the polyimide and related materials disclosed in these references.

SUMMARY OF THE INVENTION

The present invention provides a method for forming a layer of a crosslinked three-dimensional cured product of a polymerizable oligomer on an electronic component, the same providing a dielectric or passivating effect. The electronic component thus formed is also described.

The polymerizable oligomer is a specified polyamic acid, the corresponding amic ester, the corresponding isoimide, the corresponding imide, analogues thereof, or mixtures thereof.

Major objects of the present invention are to provide dielectric and/or passivating materials for use in electronic component fabrication which are formed from polymerizable oligomers which have high solubility in conventional solvents, excellent wetting and planarizing properties and which can be fully cured or crosslinked without voids, bubbles, cracks, blistering, delamination or excess shrinkage. The resulting cured products thereof have excellent adhesion, thermal stability, electrical properties, chemical resistance and can be cured at conditions such that the resulting polymeric product exhibits reduced extrinsic and intrinsic stresses.

Hereafter, the above class of polymerizable oligomers will often merely be referred to as "polymerizable oligomers", and the resulting crosslinked, three-dimensional product will be referred to as a "cured polyimide" for brevity.

DESCRIPTION OF PREFERRED EMBODIMENTS

Major Advantages of the Present Invention

The major advantages of the present invention are directly attributable to the polymerizable oligomer which is used to yield the final cured polyimide layer.

Essentially the polymerizable oligomers of the present invention provide the processing and planarizing advantages of a monomer yet the cured polyimide obtained upon curing (cross-linking) per the present invention has the superior physical and chemical properties of a high molecular weight polymer.

The cured polyimide contains essentially no voids, bubbles, non-wet areas, cracking or delamination.

It exhibits a high degree of planarization, e.g., on the order of 95%.

It can be uniformly etched back with no resultant residue.

It exhibits excellent adhesion to various surfaces, such as metals as are conventionally used in semiconductor fabrication, inorganic materials as are conventionally used e.g., silicon, silicon dioxide, silicon nitride, and the like, after final cure.

It is thermally stable to 400° C. exhibiting negligible outgassing after 10 hours at 400° C., no adhesion loss and no morphological changes. The cured polyimide does not exhibit any substantial weight loss before 400° C.

It has excellent electrical properties, e.g., its dielectric constant does not change after exposure to water or thermal cycling and it is resistant to polarization and charge inversion.

It shows excellent chemical resistance, e.g., it has a minimal tendency to absorb process solvents and it does not swell or crack when exposed to metal lift-off solvents.

A final major advantage of the cured polyimide films of the present invention is that since they can be cured at relatively low temperatures, the resultant film stress typically observed at room temperature with conventional cured polyimide layers is not encountered to any substantial extent, whereupon polyimide cracking which is often observed when prior art cured polyimide layers are exposed to solvents during processing, e.g., solvent soaks to effect lift-off of conventional organic materials and metallization layers, or processing in situ stress, such as thermal stress, are not encountered.

The polymerizable oligomers of the present invention also exhibit highly desirable characteristics for use in forming dielectric and/or passivation films or layers in electronic components, though these properties are primarily from the process viewpoint as opposed to the final device viewpoint since, in the final device, they are cured.

These highly desirable properties include the ability to be cured at low temperatures to yield a three-dimensional crosslinked network involving carbon-to-carbon crosslinking, thereby providing a cured polyimide polymer matrix that exhibits minimum stress at device operation temperatures.

Because of their low molecular weight, solutions of high solids content can be prepared that are sufficiently fluid to coat surfaces of irregular topography using simple techniques which results in less solvent content and significantly less shrinkage and stress upon solvent evaporation. While if desired an adhesion promoter can be used in accordance with the present invention, it is one substantial benefit of the present invention that an adhesion promoter is not necessary.

The Polymerizable Oligomers of the Present Invention

The polymizerable oligomers of the present invention include the polyamic acid, the corresponding amic ester, the corresponding isoimide, and analogues thereof. They can be represented by formulae of the type later set out.

As can be seen from the formulae, the end groups of the polymerizable oligomers are end-capped with a vinyl or acetylinic end group.

They are available under the trade name Thermid from the National Starch and Chemical Corp. The thermid oligomers include: Thermid LR-600 (polyamic acid), the structure of which is shown in Formula 1, Thermid AL-600 (polyamic ester), the structure of which is shown in Formula 2, and Thermid IP-600 (polyisoimide), the structure of which is shown in Formula 3, and Thermid MC-600 (polyimide), the structure which is shown in Formula 4.

As obtained, they typically have a molecular weight on the order from about 600 to about 10,000, determined by GPC.

As one skilled in the art will appreciate, the molecular weights of the polymerizable oligomers of the present invention cannot be specified as a completely definite range since there is a variability in useful molecular weights depending upon the exact polymerizable oligomer selected, the solvent selected, the desire or non-desire to use multiple polymerizable oligomer applications, the desire or non-desire to have low solvent concentrations and like considerations as will be apparent to one skilled in the art. However, for most commercial process line operations, it is contemplated that useful polymerizable oligomers will have a number average molecular weight in the range of from about 1,500 to about 8,000 as determined by GPC (herein molecular weights are on the same basis unless otherwise indicated). Currently preferred polymerizable oligomers have a molecular weight of from about 2,000 to about 4,000.

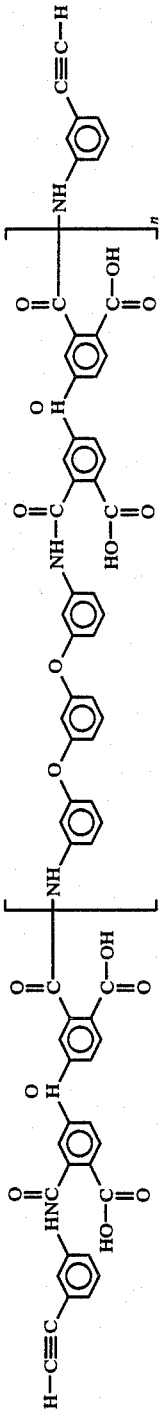
FORMULA 1
POLY(AMIC ACID)
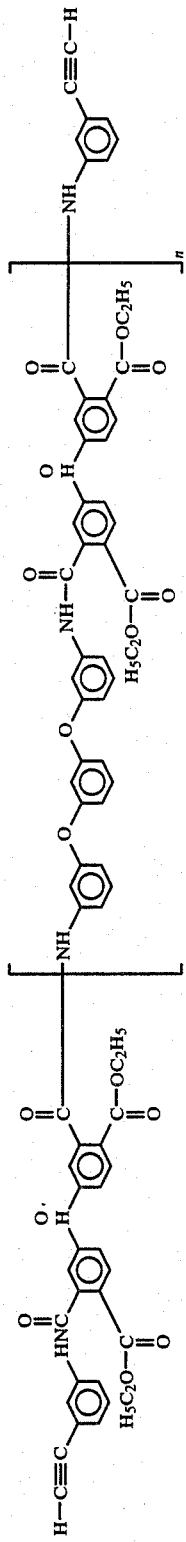
FORMULA 2
POLY(AMIC ESTER)
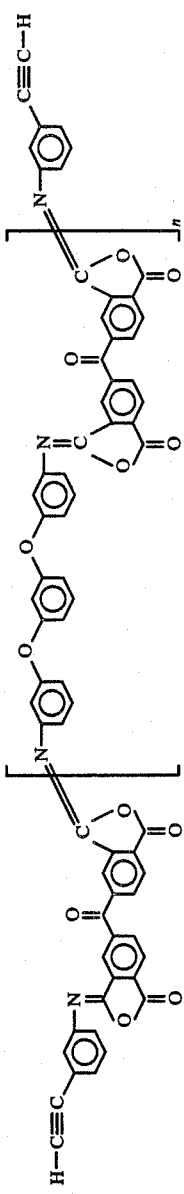
FORMULA 3
POLY(ISOIMIDE)
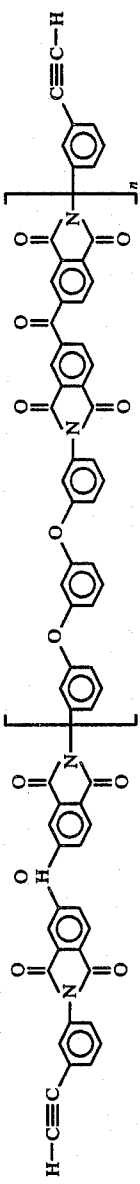
FORMULA 4
POLY(IMIDE)

The polymerizable oligomers of the present invention are soluble in common organic solvents, for example, alcohols, ketones, ethers, amides, etc., a typical exemplary solvent being N-methyl pyrrolidinone (NMP). Since they are substituted with reactive terminae they can be cured or crosslinked to yield the desired dielectric and/or passivation material in situ to provide a strong three-dimensional network which provides the desired cured polyimide of high molecular weight and good thermal and chemical properties (as opposed to conventional polyimides which cure to yield a two-dimensional network).

Mixtures of solvents can be used if desired, but we currently see no benefit to using such mixtures unless oligomer as obtained from the vendor is in a solvent and more economical solvents are available. In such cases, a mixture of compatible solvents should be useful.

Where the oligomer is used as obtained from the vendor, the solvent content of the "as obtained" oligomer should be taken into account in determining the final amount of solvent needed for coating.

There are certain differences between a polyamic acid/ester, isoimide, imide, and analogue forms, and certain are preferred as now discussed.

As received, the Thermid-LR600 amic acid (vendor information) of formula 1 has a molecular weight range of from about 600 to about 10,000. This material also contains a small amount of a gel fraction that appears on all GPC analysis as a high molecular weight fraction, e.g., on the order of 3,000,000. To obtain excellent wetting and film forming properties, it is most preferred that this commercial material be fractionated to remove the high molecular weight components, leaving a most preferred molecular weight fraction on the order of about 2,500 to about 3,000 (GPC analysis), with only traces of the gel fraction remaining.

Fractionation is performed in a conventional manner by dissolving the product as received in NMP, methyl isobutyl ketone and methyl alcohol, filtering the same through a one micron filter (which removes undissolved material having a molecular weight over about 4,000), precipating the same in toluene to remove a low molecular weight fraction, collecting the solids, dissolving the solids in acetone, filtering the same through a one micron filter, reprecipating into toluene, collecting the resulting solid and drying, whereafter the resulting product having a molecular weight of about 2,500 to about 3,000 is dissolved in NMP and passed through a one micron filter to prepare the desired coating solution.

Fractionation should also reduce the ionic content of the polyamic acid and remove unreacted monomers which might contaminate the resin and reduce its thermal stability.

The fractionated product can be dissolved in a variety of ketonic solvents, NMP, etc., and exhibits improved wetting and film forming properties as compared to the as received material, providing defect-free smooth films. Other polymerizable oligomers as received from the vendor have a number average molecular weight in the range of from about 600~1,000 to about 10,000 as earlier indicated.

The isoimide of formula 3 as received (Thermid IP-600) is pre-cyclized from the amic acid of formula 1 during synthesis to yield the isomer of the imide form of formula 4. The isoimide of formula 3 is the kinetically preferred reaction product but the imide of formula 4 is the thermo-dynamically preferred reaction product as it is more stable and is, in any case, obtained upon heating either the amic acid of formula 1 or the isoimide of formula 3.

The polymerizable oligomers can be fully cured by heating at 0.5 hours at 200° C., 0.5 hours at 300° C. and 4 hours at 400° C., with all curing above 85° C. being done under nitrogen. A consistent low rate of weight loss of equal to or less than 0.12 wt%/hour was observed, an acceptable value. This curing cycle is not mandatory, nor critical, and other curing cycles are later provided.

It is also contemplated in accordance with the present invention that copolymers of the oligomers of the present invention will be useful. An example of such a copolymer would be the polymerization product of an acetylene terminated oligomer with triethynyl benzene. Such copolymers are expected to have a higher moduli due to the presence of polytriethynyl benzene regions and are expected to have higher thermal and hydrolytic stability. The reduction in imide content would also reduce the susceptability of the cured polyimide to absorb water and polar solvents.

The polymerizable oligomers of the present invention which are end-capped with a vinyl or acetylenic end group per the present invention, most preferably an acetylenic group, which have formula 3 (the isoimide) are preferred to the amic acid of formula 1 or the imide of formula 4 (also described in U.S. Pat. No. 4,347,306 Takeda et at.) for the following reasons.

The isoimide has a high degree of solubility, comparable to the amic acid, and will form concentrated solutions suitable for spin coating in ketonic solvents as well as NMP. The ketonic solvents appear to improve wetting and film forming properties. The imide analogue, however, dissolves only in NMP.

The isoimide softens at about 160° C., well below the onset of gelation (190° C.; 6 minutes) and this capacity to soften before cross-linking occurs should result in superior planarization and film uniformity. The imide and amic acid soften at above 190° C.

The isoimide rearranges thermally to yield a cross-linked imide without the evolution of water or alcohol. This is a substantial benefit since water is tenaciously bound in polyimides and is not completely removed until samples are heated at 350° C., or above, for a minimum of 30 minutes. Continuous outgassing of solvent (NMP) and water during cross-linking could result in undesirable porosity and pin-holes.

The molecular weight distribution of the isoimide as received (powder form) is about 2,000–4,000 (GPC analysis) with no trace of a high molecular weight gel fraction. Thus, as opposed to the amic acid as received, Thermid-LR 600, no additional purification and/or fractionation need be conducted.

At present, we believe that only the amic acid as received requires fractionation.

Upon heating (150°–300° C.) the polymerizable oligomers of the present invention undergo three types of reactions: imidization via dehydration of the amic acid or elimination of alcohol from the amic ester functionalities, thermal rearrangement of the isoimide to yield the imide and radically induced addition reactions of the reactive terminal groups, be they vinyl or acetylinic end groups. The terminal end groups can add to other terminal end groups generating cross-links at chain ends or with carbonyl groups contained within the polyimide chain. These addition reactions deactivate the requisite reactive functional groups and generate the desired three-dimensional polymer network in the cured polyimide. As earlier noted, conventional linear polyimide resins undergo only imidization upon heating and result in a two-dimensional network.

Solution Formation

As indicated, the polymerizable oligomers of the present invention are most typically applied to the desired substrate in the form of a solution. Because of their low molecular weight as earlier indicated, solutions of high solids content, e.g., on the order of 70 to 80% by weight, can be prepared that are sufficiently fluid to coat surfaces of irregular topography and be easily planarized. Because of their low molecular weight, the polymerizable oligomer dissolves in ketones such as methyl isobutyl ketone, ethers such as bis-2-methoxy ethyl ether (diglyme) amides such as N-methyl pyrrolidinone, etc., resulting in a solution which readily wets a variety of surfaces, e.g., metals, silicon nitride, ceramic surfaces, silicon oxides etc.

For example, a solution of 45% by weight polyamic acid has a viscosity of 300 cp as compared to a 40% solution of a conventional polyamic acid (duPont 5878) which has a viscosity of 50–80 kcp.

The ability to coat with a concentrated polymerizable oligomer solution results in a low solvent content and significantly less shrinkage and stress upon solvent evaporation.

The polymerizable oligomer solution can be coated by conventional methods such as spin coating, spray coating, meniscus coating etc.

These solutions are prepared merely by blending the polymizerable oligomer or mixtures thereof with the desired solvent or mixtures thereof, and thereafter coating and optionally drying the same, usually at less than about 100° C. for about ½ to 2 hours, usually about 1 hour. The temperature of drying is not overly important, but it is normally desirable that the solvent be driven off without initiating any substantial degree of cross-linking. Usually inert atmospheres are used.

It is to be noted that a separate drying step is not mandatory per the present invention and, if desired, a combined dry/cure cycle can be used as later explained.

In fact, whether a separate drying step is used or a combined dry/cure cycle is used, the reason that we tend to use relatively long times for drying or for a combined dry/cure cycle is to ensure that all solvent is purged from the cured polyimide. As a matter of practice, catalytic curing itself proceeds at very low temperatures very rapidly, and thus where a separate drying step is performed, curing is rapid. However, since there is no need to use a separate drying step, usually a combined dry/cure step is used.

The thickness of the dry polymerizable oligomer film or layer is not overly important so long as the final cured polyimide exhibits its desired dielectric and/or passivating function, and is typically on the order of thicknesses as have been used for polyimides in the prior art to achieve this function.

Without being limitative in any fashion, typical thicknesses are on the order of about 1 micron to about 15 microns.

Curing Conditions

After the dried polymerizable oligomer film or layer is formed, the next active processing step insofar as the polymerizable oligomer is concerning is curing the same.

With respect to the solvent removal step, a slight amount of cross-linking during solvent removal is not unduly detrimental to the cured polyimide film of the present invention. However, since the polymerizable oligomers of the present invention tend to cross-link very rapidly once cross-linking conditions are reached, it is most preferred that substantially no cross-linking occur during solvent removal since volatilizing solvent might lead to voids, bubbles or the like. With this background in mind, we now turn to the preferred curing conditions which, of course, involve a catalytic cure.

While the polymerizable oligomers of the present invention find broad application in forming dielectric or passivating materials in electronic components, in the context of the present invention they are used primarily to form thin film dielectric or passivating layers, for example, thin films on the order of about 1 micron to about 15 microns. With such thin films, the stress generated during a high temperature cure leads to the problems earlier discussed in detail. While a thermal cure can be used to cure (crosslink) the polymerizable oligomers of the present invention, the stress problems earlier discussed can result. Accordingly, thermal curing the polymerizable oligomers of the present invention when used in thin film form is not preferred, albeit for certain non-critical applications theoretically such might be useful. Accordingly, the following discussion is directed primarily to catalytic cures which involve a low temperature curing regimen.

Thus, while curing can be by a number of procedures, e.g., thermal, chemical or radiation curing or a combination thereof, for the reasons above, per the present invention it is most preferred to cure catalytically since in this instance stresses are not generated in the cured polyimide film, which might be the case with a high temperature cure. This is a major advantage of using the polymerizable oligomers of the present invention, i.e., high temperatures cures are not necessary due to the reactive end groups. While theoretically radiation assisted cures might be considered the equivalent of catalytic cures, from a practical viewpoint the simplicity and low expense of catalytic cures is such that radiation assisted cures are not a viable commercial alternative to catalytic cures. Radiation cures are discussed herein, however, since they also do not involve the problem with thermal cures per se with respect to stress.

If a high temperature cure is contemplated as acceptable, this will typically be a stepped cure where the initial step is basically for purposes of solvent removal, e.g., for about ½ to about 2 hours at less than about 100° C., whereafter curing is completed at a higher temperature, e.g., about 200° to about 400° C. for about 4–6 hours. The time between steps is not important, but typically curing would be at 85° C. for 30 minutes, 170° C. for 1 hour, 200° C. for 1 hour (an optional 300° C. for 1 hour) and 400° C. for 4½ hours. After curing, the rate of cooling is relatively unimportant. An alternative cure cycle involves heating at 85° C. for 30 minutes, 170° C. for 1 hour, 200° C. for 1 hour (300° C. for 1 hour (this step is optional)) and 400° C. for 4½ hours. The time between steps is unimportant and can be rapid. After completion of curing, the cooling rate is unimportant. One skilled in the art will easily appreciate that other curing cycles can be used with success, but we have found the above curing cycles to offer excellent results. The atmosphere of curing is not important and is typically an inert gas, e.g., nitrogen, argon, etc., though other atmospheres could be used which would not degrade the polymerizable oligomer or the cured polyimide, e.g., air, vacuum etc.

When polyimide films are thermally cured at high temperatures, e.g., 400° C., the polymer is in mechanical equilibrium at the elevated temperature where final cure is achieved but will be under considerable extrinsic and intrinsic stress at ambient temperature or at device use temperature, e.g., 25°-85° C. Conventional polyimide films cannot relax to relieve this stress since the polyimide is below its glass transition temperature (Tg on the order of 300°-400° C.). Since conventional polyimides do not cross-link during curing, rather, have a two-dimensional structure, they are readily fractured under process conditions of high stress and readily swell in the presence of process solvents. Only polyimides of very long chain length and high molecular weight are resistant to cracking. These polyimides still swell when exposed to process solvents; however, and swelling, but these high molecular weight polyimides do not readily dissolve in common process solvents used for coating and form poor films due to poor wetting properties.

As earlier indicated, a major problem encountered with high temperature curing of polyimide thin films in semiconductor device fabrication is that the resultant film stress observed at room temperature (or device use temperature) can result in polyimide cracking when the film is exposed to solvents during processing or to thermal stress.

Per the present invention, to avoid this problem the soluble, low molecular weight polymerizable oligomers, which are capped with vinyl or acetylenic end groups, are catalytically cured.

Any catalyst can be used which will cause three-dimensional cross-linking of the polymerizable oligomers of the present invention, and the amount of catalyst required is simply that which will enable the catalysis reaction to effectively proceed.

Normally, the catalyst, or catalysts, if a stepped catalytic reaction is desired, is/are added to the solution of the polymerizable oligomer prior to coating the same.

The catalysts used per the present invention are conventional and can be freely selected from those in the prior art used to catalyze the crosslinking of monomers or oligomers to the cured polyimide form.

Useful catalysts include volatile peroxide catalysts such as benzoyl peroxide, dicumyl peroxide, etc.

As indicated, catalyst proportions are not overly important so long as the desired catalytic effect is achieved. Normally, however, proportions are on the order of about 0.05 to about 10 weight percent based on the weight of the polymerizable oligomer in the film or layer thereof prior to curing.

One substantial advantage, as indicated, of using a catalyst is that curing can be effected at low temperatures. The temperature selected obviously must be one that would activate the catalyst involved. For the peroxide catalysts, this is typically on the order of about 180° C. to about 195° C. The time of curing is relatively unimportant when a catalyst is used since curing per se is very rapidly effected.

Again a combined dry/cure cycle is used. Primary drying is generally at a temperature where catalyst scission does not occur, e.g., about ½ to about 2 hours at a temperature lower than the catalyst scission temperature. Note in the Example about 40 minutes are spent at 170° C. or less. Thereafter the temperature is stepped to over the catalyst scission temperature, e.g., to over 200° C., typically 200°~300° C., normally for about 1 to about 2 hours. Of course, other curing cycles can be used.

As an alternative to heating such a catalytic system, ultraviolet radiation or electron beam radiation can be used to initiate the catalyst. Due to the relatively expensive equipment required for radiation induced catalysis, such is not preferred per the present invention. It is discussed, however, for purposes of completeness. Conditions are selected in a conventional manner so as to initiate the catalyst. In any case, whether thermal, thermal-catalytic or radiation-catalytic reactions are used, the final cross-linked density of the cured polyimide film will depend, of course, on the amount of catalyst used and the ratio of polymer repeating units to end groups. Typically the end groups will comprise on the order of about 1 to about 2 wt.% of the total polymer.

By developing the polymer three-dimensional network at low temperatures, minimized film stress at operating temperature should result. Imidization can be completed by a combination of chemical dehydration and thermal annealing after crosslinking has occurred which should not result in a significant change in the intrinsic stress in the cured polyimide film.

The three-dimensional network resulting from controlled radical coupling and addition reactions of the polymerizable oligomers of the present invention is significantly more resistant to deformation and cracking than are the two-dimensional conventional polyimide structures.

The presence of inter-chain crosslinks should reduce the capability of the cured polyimide to outgas as a result of thermal degradation. Although bond scission will occur as a result of heating, fewer volatile groups are generated due to the presence of the crosslinks.

Due to the higher carbon content and greater polymer density after curing as compared to conventional polyimides, the cured polyimide of the present invention is significantly more hydrophobic than conventional polyimides. For example, after conditioning for 1,000 hours at 50° C. and 96% relative humidity, the cured polyimide of the present invention contained less than 1% water and no change in the dielectric constant thereof was observed.

It is to be noted that compounds represented by formula 3 can be imidized at room temperature by dehydration with dehydrating agents such as trifluoroacetic anhydride, acetic anhydride-acetic acid or dicyclohexyl carbodiimides and then cured by cross-linking the same as earlier described. The amic acid and esters can be initially catalytically cured and then imidized by such dehydration techniques after the 3-dimensional network has been formed.

Following curing, if it is desired or necessary to remove the cured polyimide of the present invention so as to planarize the surface thereof, this can be effected using a conventional reactive ion etching in a manner known in the art. Such is described in detail in "A Survey of Plasma-Etching Processes" by Richard L. Bersin, published in Solid State Technology, May 1976, pages 31–36, and "Reactive Ion Etching in Chlorinated Plasma" by Geraldine C. Schwartz et al, Solid State Technology, November 1980, pages 85–91, both hereby incorporated by reference. Following the procedure of these publications, the cured polyimide of the present invention can be uniformly etched back with no resultant residue.

The Metallurgy

The polymerizable oligomers of the present invention can be applied to any type of metallurgy as is conventionally used in electronic devices. We have encountered no problem with cured polyimide adhesion to any type of conventional metallurgy so long as, of course, the curing conditions are appropriately selected.

Of course, metallurgy which is formed on the cured polyimide must not be formed at a temperature which would degrade the cured polyimide or cause substantial outgassing during metallurgy deposition.

The metallurgy may be formed in a conventional manner, e.g., vacuum evaporation, sputtering, etc.

Metallurgy thicknesses as are conventionally used in the art.

Lithographic Processing

In many instances, it may be necessary or desirable to pattern the polymerizable oligomer or cured polyimide layer or film formed per the present invention.

In this situation, after the polymerizable oligomer or cured polyimide layer or film is formed at the desired thickness, a conventional photoresist is applied, exposed and developed (removed) in a conventional manner to yield the desired pattern, whereafter the photopolymerizable oligomer or cured polyimide is removed in a conventional manner, typically using solvents as are known in the art.

Exposure and development of the photoresist is typically following vendor's instructions.

Subsequent Processing

As one skilled in the art will appreciate, after a cured polyimide layer or film is formed per the present invention, additional layers of metallurgy or other conventional layers as are used in the semiconductor arts can be applied to the cured polyimide and processed as desired.

Since such processing steps are conventional, they will not be recited here in detail. For example, assuming that a first layer of metallurgy is formed and the curved polyimide layer of the present invention is formed thereon, a second layer of metallurgy could be formed on the cured polyimide layer in electrical connection through the openings in the cured polyimide layer (generated by the photoresist technique above) to the first metallurgy layer.

Thereafter, an additional layer or film of cured polyimide per the present invention could be formed on the metallurgy, processed as above, and further processing sequences conducted a number of times to build a multilevel structure where dielectric separation or isolation is achieved using the cured polyimide of the present invention.

Layers can also, of course, be passivated as desired in a conventional manner.

In essence, the above steps can be repeated a plurality of times until the desired device levels are obtained, typically levels of metallurgy, separated by the cured polyimide of the present invention.

Having thus generally described the invention, the following working example is offered to illustrate the same.

EXAMPLE

The polymerizable oligomer selected was Thermid IP-600 (the isoimide). It was obtained in powder form and had a molecular weight on the order of about 2,000 to about 4,000.

It was dissolved in NMP at ambient to provide a spinning or casting solution containing 30 weight percent of the isoimide based on solution weight.

For purposes of illustration, the substrate selected was silicon dioxide. This is a conventional semiconductor substrate. Of course, the isoimide could also be used as a direct replacement for the polyimide material of the earlier incorporated by reference U.S. Patent to Takeda et al.

A layer of typical metallurgy as is used in the art, in this case, Al-Cu(98 weight percent:2 weight percent) was formed on the silicon dioxide substrate in a conventional manner by standard vacuum evaporation.

The metallurgy was then patterned in a conventional manner using a standard positive photoresist following the vendor's instructions, thereby forming a metallurgical pattern on the silicon dioxide substrate.

The isoimide solution (earlier formed as indicated above at ambient conditions) was spun onto the patterned metallurgy to a thickness of 2-5 microns.

No drying step was used, rather, a combined dry/cure step was used in an inert atmosphere, specifically nitrogen.

The time of temperature elevation was not important and was merely the time necessary to raise the atmosphere in the dry/cure furnace used from one temperature to the next. The times and temperatures were (starting at ambient): 85° C., 10 minutes; 170° C., one-half hour; 200° C., one-half hour; 300° C., one-half hour; and 400° C., 4 and one-half hours. No catalyst was used, i.e., in this particular instance a straight thermal cure was used.

As earlier indicated, however, this can lead to substantial stress problems and is not preferred.

Accordingly, the above procedure was duplicated except that instead of using a straight thermal cure, a catalytic cure was used. Specifically, about 5 weight percent based on the weight of the isoimide of dicumyl peroxide was mixed at ambient temperature with the isoimide and NMP to form the spinning solution.

Again, a combined dry/cure was used at the following conditions: 85° C., 10 minutes; 170° C., one-half hour; 200° C., one hour; 250° C., one hour.

As earlier indicated, the major reason for using the relatively long times, be it in the case of a thermal cure or a catalytic cure, the time of course being shorter with a catalytic cure, is to ensure essentially complete solvent drive-off. If a separate drying step is used, substantially lesser times are required for a thermal cure or a catalytic cure.

Following processing as above, the device intermediate was removed from the furnace and permitted to cool in the air at ambient conditions.

Conditions of cooling are not important; of course, the cooling rate should not be so fast that any device component would crack or the like, but this will be apparent to one skilled in the art.

While there (have/has) been described what (is/are) at present considered to be the preferred embodiment(s) of this invention, it will be obvious to those skilled in the art that various changes and modifications may be made therein without departing from the invention, and it is, therefore, intended to cover all such changes and modifications as fall within the true spirit and scope of the invention.

We claim:

1. A method for forming a thin film of a dielectric material on an electronic component which comprises applying thereto a layer of a polymerizable oligomer selected from the group consisting of polyamic acids, the corresponding polyamic esters, the corresponding polyisoimides, or mixtures thereof, wherein the end groups of the polymerizable oligomer are end-capped with a vinyl or acetylenic end group; and curing the layer of polymerizable oligomer at temperatures below about 300° C., whereby the resulting cured polyimide exhibits low extrinsic and intrinsic stress.

2. A method for forming superposed levels of metallurgy on an integrated circuit array comprising a semiconductor substrate, a dielectric layer on the substrate, a plurality of semiconductor devices integrated on the substrate, and a first electrical conductor pattern on the dielectric layer electrically connected to at least one of the semiconductor devices, comprising:

(A) coating the substrate with a layer of a polymerizable oligomer selected from the group consisting of polyamic acids, polyamic esters thereof, polyisoimides, or mixtures thereof, wherein the end groups of the polymerizable oligomer are end capped with a vinyl or acetylenic end group;

(B) lithographically forming openings in the coating in a pattern exposing a predetermined portion of the first electrical conductor or pattern;

(C) curing the layer of polymerizable oligomer at temperatures below about 300° C. whereby the resulting cured polyimide exhibits low extrinsic and intrinsic stress;

(D) forming a second electrical conductor pattern in electrical connection through the openings to the first conductor pattern; and (E) passivating the integrated circuit array.

3. The method of claim 2 which comprises repeating steps (A) through (D) until the desired levels of conductor patterns are obtained.

4. A method of forming a thin film of a dielectric material on an electronic component comprising:

(A) applying to the electronic component a layer comprising a polymerizable oligomer selected from the group consisting of polyamic acids, the corresponding polyamic esters, and the corresponding polyisoimides or mixtures thereof, wherein the end groups of the polymerizable oligomer are end capped with a vinyl or acetylenic end group; and (B) curing the layer of polymerizable oligomer upon said electronic component at temperatures below about 300° C., whereby the resulting crosslinked polyimide exhibits low extrinsic and intrinsic stress.

5. The method of claim 4 wherein said curing is accomplished using a catalytic technique.

6. The method of claim 5 wherein said curing is accomplished using a combined dry/cure cycle ranging between about 85° C. and about 300° C.

7. The method of claim 4 wherein said curing is accomplished using radiation.

8. The method of claim 4 wherein said polymerizable oligomer is comprised of said polyisoimide.

9. The method of claim 8 wherein said curing is accomplished using a catalytic technique.

10. The method of claim 9 wherein the catalyst utilized is a peroxide.

11. The method of claim 10 wherein said curing is accomplished using a combined dry/cure cycle ranging between about 85° C. and about 300° C.

12. A method of forming a thin film of a dielectric material on an electronic component comprising:

(A) applying to said electronic component a layer comprising a polymerizable oligomer selected from the group consisting of polyamic acids, the corresponding polyamic esters, and the corresponding polyisoimides or mixtures thereof, wherein the end groups of the polymerizable oligomer are end capped with a vinyl or acetylenic end group; and (B) curing said layer of polymerizable oligomer upon said electronic component.

13. The method of claim 12 wherein the combined dry/cure temperature cycle ranges from about 85° C. to about 400° C.

14. The method of claim 12 wherein said polyamic acid exhibits a molecular weight ranging from about 2,500 to about 3,000.

15. A method for forming superposed levels of metallurgy on an integrated circuit array comprising a semiconductor substrate, a dielectric layer on the substrate, a plurality of semiconductor devices integrated on the substrate, and a first electrical conductor pattern on the dielectric layer electrically connected to at least one of the semiconductor devices, comprising:

(A) coating the substrate with a layer of a polymerizable oligomer selected from the group consisting of polyamic acids, the corresponding polyamic esters, the corresponding polyisoimides or mixtures thereof, wherein the end groups of the polymerizable oligomer are end capped with a vinyl or acetylenic end group;

(B) lithographically forming openings in the coating in a pattern exposing a predetermined portion of the first electrical conductor pattern;

(C) curing the layer of polymerizable oligomer using cure temperatures as high as about 400° C.;

(D) forming a second electrical conductor pattern in electrical connection through the openings to the first conductor pattern; and (E) passivating the integrated circuit array.

16. A method of forming a multilayer structure wherein at least one polymeric insulating layer separates at least portions of other layers, and wherein at least one of the other layers comprises conductors comprising:

(A) applying a polymeric material, which is comprised of a polymerizable oligomer selected from the group consisting of polyamic acids, polyamic esters, polyisoimides or mixtures thereof, wherein the end groups of the polymerizable oligomer are end capped with a vinyl or acetylenic end group, to a surface of the multilayer structure;

(B) curing the polymerizable oligomer using a combined dry/cure cycle ranging between about 85° C. and about 300° C. to provide a polymeric insulating material; and (C) applying a layer of metallurgy or other conventional material as is used in the semiconductor arts to at least a portion of the surface of the cured polymeric insulating material of step (B).

17. A method of forming a multilayer structure wherein at least one polymeric insulating layer separates at least portions of other layers, and wherein at least one of the other layers comprises conductors, comprising:
- (A) applying a polymeric material, which is comprised of a polymerizable oligomer selected from the group consisting of polyamic acids, polyamic esters, polyisoimides or mixtures thereof, wherein the end groups of the polymerizable oligomer are end capped with a vinyl or acetylenic end group, to a surface of the multilayer structure;
- (B) curing the polymerizable oligomer using a combined dry/cure cycle ranging between about 85° C. and about 300° C. to provide a polymeric insulating material;
- (C) lithographically forming openings in the cured polymeric insulating material; and
- (D) applying a layer of metallurgy or other conventional material as is used in the semiconductor arts to at least a portion of the surface of the cured polymeric insulating material of step (C).

18. A method of forming a multilayer structure wherein at least one polymeric insulating layer separates at least portions of other layers, and wherein at least one of the other layers comprises conductors, comprising:
- (A) applying a polymeric material, which is comprised of a polymerizable oligomer selected from the group consisting of polyamic acids, polyamic esters, polyisoimides or mixtures thereof, wherein the end groups of the polymerizable oligomer are end capped with a vinyl or acetylenic end group, to a surface of the multilayer structure;
- (B) curing the polymerizable oligomer at temperatures as high as about 400° C. to form a polymeric insulating material; and
- (C) applying a layer of metallurgy or other conventional material as is used in the semiconductor arts to at least a portion of the surface of the cured polymeric insulating material of step (B).

19. A method of forming a multilayer structure wherein at least one polymeric insulating layer separates at least portions of other layers, and wherein at least one of the other layers comprises conductors, comprising:
- (A) applying a polymeric material which is comprised of a polymerizable oligomer selected from the group consisting of polyamic acids, polyamic esters, polyisoimides or mixtures thereof, wherein the end groups of the polymerizable oligomer are end capped with a vinyl or acetylenic end group, to a surface of the multilayer structure;
- (B) curing the polymerizable oligomer at temperatures as high as about 400° C. to form a polymeric insulating material;
- (C) lithographically forming openings in the polymeric insulating material; and
- (D) applying a layer of material of metallurgy or other conventional material as is used in the semiconductor arts to at least a portion of the surface of the cured polymeric insulating material of step C.

* * * * *

UNITED STATES PATENT AND TRADEMARK OFFICE
CERTIFICATE OF CORRECTION

PATENT NO. : 4,654,223

DATED : March 31, 1987

INVENTOR(S) : Constance J. Araps, Steven M. Kandetzke, Mark A. Takacs

It is certified that error appears in the above-identified patent and that said Letters Patent is hereby corrected as shown below:

In the Title, Prior to "COMPONENT", delete "ELECTRIC" and insert -- ELECTRONIC -- .

In the Specification,

Col. 1, line 43, after "is", delete "the earlier Shiro et al European Pa -" and insert -- U.S. Pat. No. 4,347,306 to Takeda et al. -- .

line 44, prior to ", since", delete "tent Application".

Col. 1, line 58, after "isoimide," delete "the corresponding imide".

Col. 5 and Col. 6, Formula 1, the portions of the formula reading 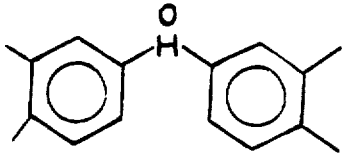

should read 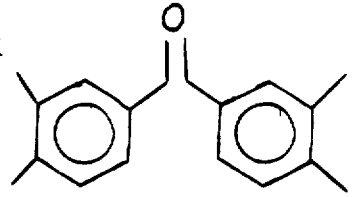

UNITED STATES PATENT AND TRADEMARK OFFICE
CERTIFICATE OF CORRECTION

PATENT NO. : 4,654,223

DATED : March 31, 1987

INVENTOR(S) : Constance J. Araps, Steven M. Kandetzke, Mark A. Takacs

It is certified that error appears in the above-identified patent and that said Letters Patent is hereby corrected as shown below:

Formula 2, the portions of the formula reading 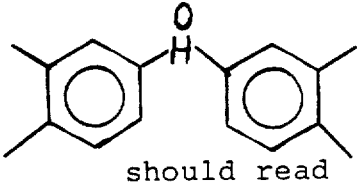 should read 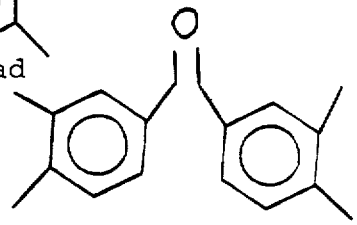

Formula 4, the portions of the formula reading 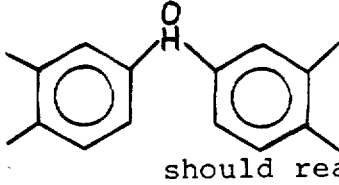 should read 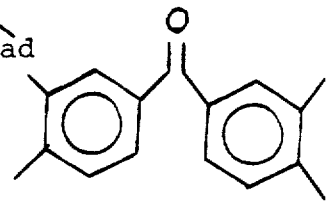

Signed and Sealed this

Fifteenth Day of September, 1987

Attest:

DONALD J. QUIGG

Attesting Officer     Commissioner of Patents and Trademarks